United States Patent
Sato et al.

(10) Patent No.: US 9,876,101 B2
(45) Date of Patent: Jan. 23, 2018

(54) SEMICONDUCTOR SUBSTRATE AND SEMICONDUCTOR DEVICE

(71) Applicants: SANKEN ELECTRIC CO., LTD., Niiza-shi, Saitama (JP); SHIN-ETSU HANDOTAI CO. LTD., Tokyo (JP)

(72) Inventors: Ken Sato, Miyoshi (JP); Hiroshi Shikauchi, Niiza (JP); Hirokazu Goto, Minato-ku (JP); Masaru Shinomiya, Annaka (JP); Kazunori Hagimoto, Takasaki (JP); Keitaro Tsuchiya, Takasaki (JP)

(73) Assignees: SANKEN ELECTRIC CO., LTD., Saitama (JP); SHIN-ETSU HANDOTAI CO., LTD, Tokyo (JP)

( * ) Notice: Subject to any disclaimer, the term of this patent is extended or adjusted under 35 U.S.C. 154(b) by 0 days.

(21) Appl. No.: 15/302,684

(22) PCT Filed: Mar. 12, 2015

(86) PCT No.: PCT/JP2015/001371
§ 371 (c)(1),
(2) Date: Oct. 7, 2016

(87) PCT Pub. No.: WO2015/159481
PCT Pub. Date: Oct. 22, 2015

(65) Prior Publication Data
US 2017/0033209 A1 Feb. 2, 2017

(30) Foreign Application Priority Data
Apr. 18, 2014 (JP) .................................. 2014-86397

(51) Int. Cl.
*H01L 29/20* (2006.01)
*H01L 29/778* (2006.01)
(Continued)

(52) U.S. Cl.
CPC ...... *H01L 29/7786* (2013.01); *H01L 21/0242* (2013.01); *H01L 21/0254* (2013.01);
(Continued)

(58) Field of Classification Search
CPC ............. H01L 29/2003; H01L 21/0254; H01L 21/02458; H01L 27/1211
See application file for complete search history.

(56) References Cited

U.S. PATENT DOCUMENTS

2007/0004184 A1* 1/2007 Saxler ................. H01L 29/7787
438/479
2007/0034883 A1* 2/2007 Ohba ...................... H01L 33/08
257/85
(Continued)

FOREIGN PATENT DOCUMENTS

JP  2006-033236 A   2/2006
JP  2006-332367 A   12/2006
(Continued)

OTHER PUBLICATIONS

May 12, 2015 International Search Report issued in Patent Application No. PCT/JP2015/001371.
(Continued)

*Primary Examiner* — Thao P Le
(74) *Attorney, Agent, or Firm* — Oliff PLC

(57) ABSTRACT

A semiconductor substrate including a substrate, a buffer layer having a nitride-based semiconductor containing carbon provided on the substrate, a high-resistance layer having a nitride-based semiconductor containing carbon provided on the buffer layer, and a channel layer having a nitride-based semiconductor provided on the high-resistance layer, the high-resistance layer including a first region having carbon concentration lower than that of the buffer layer, and a second region which is provided between the first region
(Continued)

and the channel layer, and has the carbon concentration higher than the first region. As a result, it is possible to provide the semiconductor substrate which can reduce a leak current by enhancing crystallinity of the high-resistance layer while maintaining a high resistance of the high-resistance layer, and suppress occurrence of a decrease in electron mobility or current collapse in the channel layer by likewise enhancing crystallinity of the channel layer formed on the high-resistance layer.

11 Claims, 10 Drawing Sheets

(51) Int. Cl.
    *H01L 29/66*     (2006.01)
    *H01L 29/207*     (2006.01)
    *H01L 21/02*     (2006.01)

(52) U.S. Cl.
    CPC .... *H01L 21/0262* (2013.01); *H01L 21/02378* (2013.01); *H01L 21/02458* (2013.01); *H01L 21/02579* (2013.01); *H01L 29/2003* (2013.01); *H01L 29/207* (2013.01); *H01L 29/66462* (2013.01)

(56) References Cited

U.S. PATENT DOCUMENTS

| | | | |
|---|---|---|---|
| 2008/0197359 A1 | 8/2008 | Imanishi et al. | |
| 2009/0008659 A1* | 1/2009 | Ohno | B82Y 20/00 257/96 |
| 2009/0189190 A1* | 7/2009 | Hashimoto | H01L 21/02389 257/194 |
| 2010/0123169 A1 | 5/2010 | Sato | |
| 2010/0230687 A1* | 9/2010 | Hashimoto | H01L 29/2003 257/76 |
| 2011/0062556 A1* | 3/2011 | Komiyama | H01L 21/02458 257/615 |
| 2012/0025202 A1* | 2/2012 | Makabe | H01L 21/02381 257/76 |
| 2012/0025203 A1 | 2/2012 | Nakata et al. | |
| 2013/0009202 A1* | 1/2013 | Enya | H01L 33/32 257/103 |
| 2013/0069208 A1 | 3/2013 | Briere | |
| 2013/0240901 A1* | 9/2013 | Kohda | H01L 29/2003 257/76 |
| 2014/0061665 A1 | 3/2014 | Tsuchiya | |
| 2014/0339598 A1* | 11/2014 | Park | H01L 33/325 257/101 |
| 2015/0060765 A1 | 3/2015 | Kotani et al. | |
| 2016/0118488 A1* | 4/2016 | Nagahisa | H01L 29/7786 257/76 |

FOREIGN PATENT DOCUMENTS

| | | |
|---|---|---|
| JP | 2008-205146 A | 9/2008 |
| JP | 2010-123725 A | 6/2010 |
| JP | 2011-082494 A | 4/2011 |
| JP | 2012-033646 A | 2/2012 |
| JP | 5064824 B2 | 10/2012 |
| JP | 2013-070053 A | 4/2013 |
| JP | 2014-049674 A | 3/2014 |
| JP | 2015-053328 A | 3/2015 |

OTHER PUBLICATIONS

Oct. 18, 2016 International Preliminary Report on Patentability issued in Patent Application No. PCT/JP2015/001371.
Jun. 6, 2017 Office Action issued in Japanese Patent Application No. 2014-086397.
Feb. 23, 2017 Office Action issued in Taiwanese Patent Application No. 104109013.

* cited by examiner

SEMICONDUCTOR SUBSTRATE AND SEMICONDUCTOR DEVICE

BACKGROUND OF THE INVENTION

1. Field of the Invention

The present invention relates to a semiconductor substrate and a semiconductor device fabricated by using this semiconductor substrate.

2. Description of the Related Art

A semiconductor substrate using a nitride semiconductor is used in a power device or the like which operates with a high frequency and a high output power. In particular, as a device which is suitable to perform amplification in a high-frequency band of microwaves, submillimeter waves, millimeter waves, and others, for example, a high electron mobility transistor (HEMT) or the like is known.

As the semiconductor substrate using the nitride semiconductor, there is known a semiconductor substrate having a buffer layer, a GaN layer, and a barrier layer composed of AlGaN sequentially stacked on a Si substrate.

In a lower layer (a high-resistance layer) in the GaN layer, when electrical resistances in a longitudinal direction and a lateral direction are increased, off characteristics of a transistor can be improved, and longitudinal direction leak is suppressed, thereby realizing a high breakdown voltage. Thus, carbon is doped into the GaN layer, a deep level is formed in a GaN crystal, and n-type conduction is suppressed.

On the other hand, an upper layer in the GaN layer functions as a channel layer and it can be a cause of current collapse (a phenomenon that reproducibility of output current characteristics is degraded) when a level to trap a carrier is formed, and hence concentration of carbon and the like needs to be sufficiently reduced (see Patent Literature 1-3).

Further, Patent Literature 4 discloses that a resistance is increased by adding Fe to a GaN layer, and also discloses that carbon is further added to stabilize an energy level of Fe.

Furthermore, Patent Literature 5 discloses that Fe is added to a GaN layer in order to reduce a parasitic resistance and increase a breakdown voltage.

CITATION LIST

Patent Literatures

Patent Literature 1: Japanese Patent No. 5064824
Patent Literature 2: Japanese Unexamined Patent Publication (Kokai) No. 06-332367
Patent Literature 3: Japanese Unexamined Patent Publication (Kokai) No. 2013-070053
Patent Literature 4: Japanese Unexamined Patent Publication (Kokai) No. 2012-033646
Patent Literature 5: Japanese Unexamined Patent Publication (Kokai) No. 2010-123725

SUMMARY OF THE INVENTION

As described above, the high-resistance layer is used to suppress a longitudinal direction (a thickness direction) leak current of a device and improve the off characteristics of the transistor by increasing the carbon concentration thereof, and the present inventors examined about crystallinity of the high-resistance layer having the high carbon concentration.

FIG. 9 shows growth temperature dependence of crystallinity of the high-resistance layer, and FIG. 10 shows the growth temperature dependence of carbon concentration of the high-resistance layer.

As can be understood from FIGS. 9 and 10, when a growth temperature is lowered, the carbon concentration in the high-resistance layer can be increased, but the crystallinity of the high-resistance layer is adversely lowered.

When the crystallinity of the high-resistance layer is lowered, the leak current increases, and the crystallinity of a channel layer formed on this layer is also lowered, which leads to a problem that a decrease in electron mobility or current collapse in the channel layer occurs.

In view of the above problem, it is an object of the present invention to provide a semiconductor substrate and a semiconductor device which can reduce a leak current by increasing the crystallinity of a high-resistance layer while maintaining a high resistance of the high-resistance layer, and also can suppress occurrence of a decrease in electron mobility or current collapse in a channel layer by increasing the crystallinity of a channel layer formed on the high-resistance layer.

To achieve the object, the present invention provides a semiconductor substrate including a substrate, a buffer layer, which is composed of a nitride-based semiconductor containing carbon, provided on the substrate, a high-resistance layer, which is composed of a nitride-based semiconductor containing carbon, provided on the buffer layer, and a channel layer, which is composed of a nitride-based semiconductor, provided on the high-resistance layer, the high-resistance layer including a first region having carbon concentration lower than that of the buffer layer, and a second region which is provided between the first region and the channel layer, and has the carbon concentration higher than the first region.

As described above, since the high-resistance layer has the first region which has the lower carbon concentration than that of the buffer layer and the second region which is provided between the first region and the channel region and has the higher carbon concentration than that of the first region, the crystallinity of the high-resistance layer can be enhanced while maintaining the high resistance of the high-resistance layer, a leak current can be thereby reduced, and the crystallinity of the channel layer formed on the high-resistance layer can be also improved, thus suppressing occurrence of a decrease in electron mobility or current collapse in the channel layer.

At this time, it is preferable that the first region contains a transition metal and transition metal concentration in the first region is higher than transition metal concentration in the second region.

When the first region contains the transition metal at the higher concentration than the transition metal concentration of the second region, an increase in longitudinal direction leak current can be suppressed in the first region having the low carbon concentration, the crystallinity of the first region can be further enhanced, and the crystallinity of the nitride-based semiconductor formed above the first region can be further improved.

At this time, it is preferable that the transition metal concentration in the first region is $1\times10^{17}$ atoms/cm$^3$ or more and $1\times10^{20}$ atoms/cm$^3$ or less, particularly $1\times10^{18}$ atoms/cm$^3$ or more and $1\times10^{19}$ atoms/cm$^3$ or less.

When the transition metal concentration of the first region falls within the above-described concentration range, an increase in longitudinal direction leak current in the first region can be surely suppressed, and the crystallinity of the nitride-based semiconductor formed above the first region can be surely improved.

At this time, it is preferable that the first region contains the transition metal and a thickness of the first region is 3 nm or more and 3000 nm or less.

In a case where the first region contains the transition metal, when the thickness of the first region falls within the above-described range, the crystallinity of the nitride-based semiconductor formed above the first region can be improved while maintaining a high resistance of the first region.

At this time, it is preferable that the first region does not contain a transition metal, and a thickness of the first region is 3 nm or more and 500 nm or less.

In a case where the first region does not contain the transition metal, when the thickness of the first region falls within the above-described range, the crystallinity of the nitride-based semiconductor formed above the first region can be improved while maintaining suppression of the longitudinal direction leak current.

At this time, it is preferable that the first region is in contact with the buffer layer.

When the first region having the high crystallinity is provided to be closer to the buffer layer side (namely, closer to the substrate side) in this manner, the crystallinity of the nitride-based semiconductor formed above the first region can be more effectively improved.

At this time, it is preferable that the carbon concentration in the first region is less than $1 \times 10^{18}$ atoms/cm$^3$ and the carbon concentration in the second region is $1 \times 10^{18}$ atoms/cm$^3$ or more and $1 \times 10^{19}$ atoms/cm$^3$ or less.

As the carbon concentrations of the first region and the second region, the above-described concentration ranges can be preferably used.

Further, the present invention provides a semiconductor device fabricated by using the semiconductor substrate, electrodes being provided on the channel layer.

According to the semiconductor device fabricated with the use of the semiconductor substrate of the present invention, the crystallinity of the high-resistance layer can be enhanced while maintaining the high resistance of the high-resistance layer, a leak current can be thereby reduced, and the crystallinity of the channel layer formed on the high-resistance layer can be further enhanced, thus suppressing occurrence of a decrease in electron mobility or current collapse in the channel layer.

As described above, according to the present invention, the crystallinity of the high-resistance layer can be enhanced while maintaining the high resistance of the high-resistance layer, the leak current can be thereby reduced, and the crystallinity of the channel layer formed on the high-resistance layer can be also enhanced, thus suppressing occurrence of a decrease in electron mobility or current collapse in the channel layer.

DETAILED DESCRIPTION OF THE PREFERRED EMBODIMENTS

As described above, a high-resistance layer is used to suppress a longitudinal direction leak current of a device and improve off characteristics of a transistor by increasing a carbon concentration thereof, but crystallinity of the high-resistance layer is lowered when the carbon concentration is increased. When the crystallinity of the high-resistance layer is lowered, the leak current increases, and crystallinity of a channel layer formed on the high-resistance layer is also lowered, which leads to a problem that a decrease in electron mobility or current collapse in the channel layer occurs.

Thus, the present inventors have keenly studied about a semiconductor substrate which can reduce a leak current by enhancing crystallinity while maintaining a high resistance of a high-resistance layer, and can suppress occurrence of a decrease in electron mobility or current collapse in a channel layer by likewise enhancing crystallinity of the channel layer formed on the high-resistance layer. As a result, the present inventors have found out that, when a first region which has carbon concentration lower than that of the buffer layer and a second region which is provided between the first region and the channel layer and has carbon concentration higher than that of the first region are provided in the high-resistance layer, the crystallinity of the high-resistance layer can be enhanced while maintaining the high resistance of the high-resistance layer, the leak current can be thereby reduced, and the crystallinity of the channel layer formed on the high-resistance layer can be also enhanced to enable suppressing occurrence of a decrease in electron mobility or current collapse in the channel layer, thereby bringing the present invention to completion.

The present invention will now be explained as an example of an embodiment in detail hereinafter with reference to the drawings, but the present invention is not restricted thereto.

First, a semiconductor substrate representing an example of an embodiment of the present invention will now be described with reference to FIGS. 1 and 2.

Figure 1:
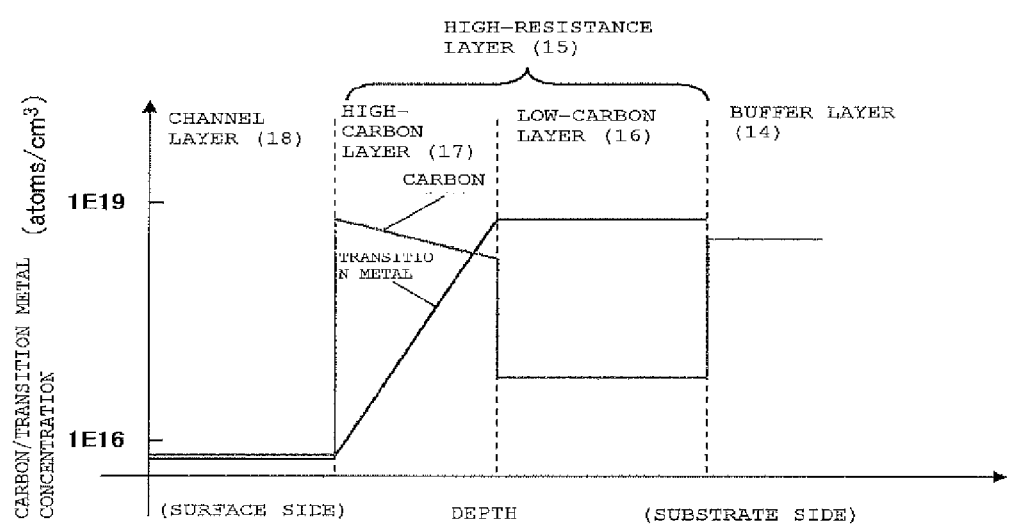
FIG. 1 is a view showing a concentration distribution of a semiconductor substrate in a depth direction showing an example of an embodiment of the present invention.
Figure 2:
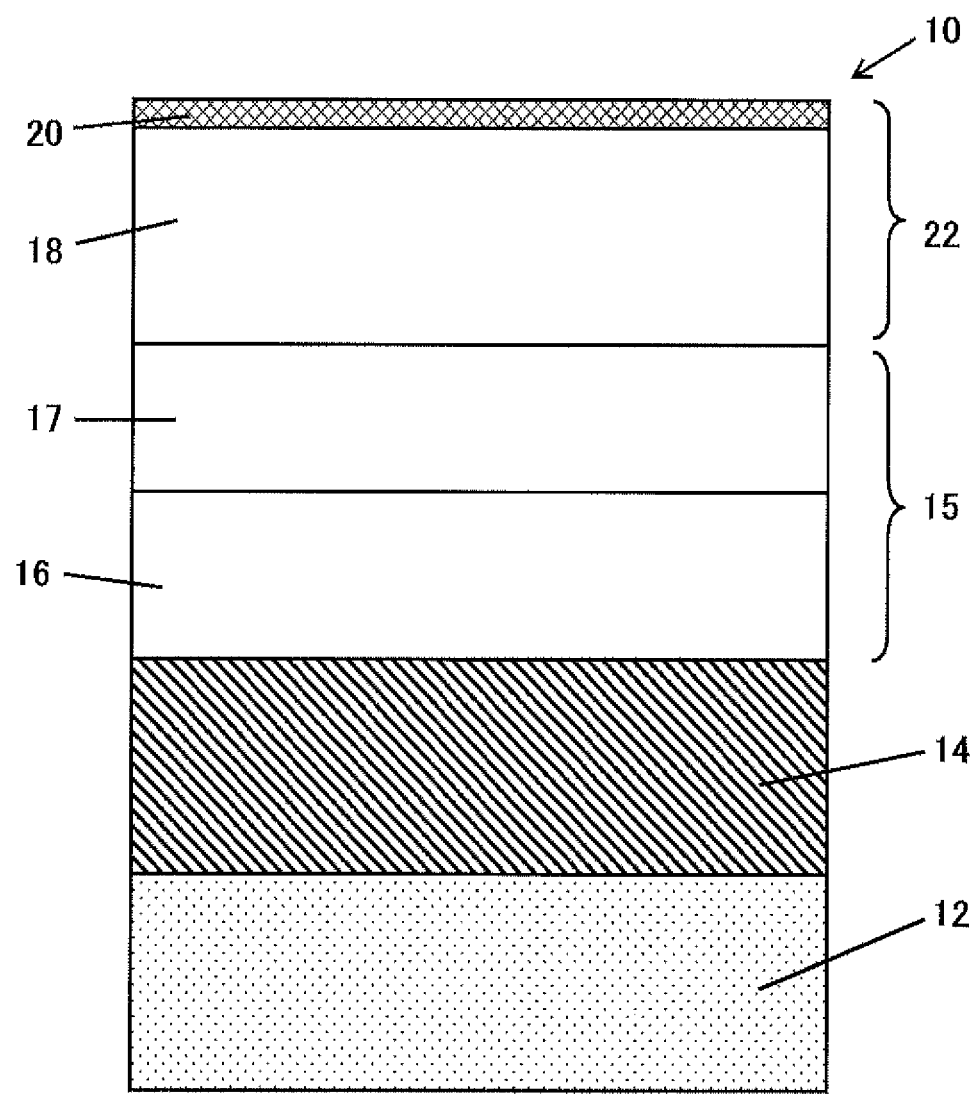
FIG. 2 is a cross-sectional view of the semiconductor substrate showing an example of an embodiment of the present invention.

FIG. 1 is a view showing a concentration distribution in a depth direction of a semiconductor substrate representing an example of an embodiment of the present invention, and FIG. 2 is a cross-sectional view of the semiconductor substrate of the present invention.

A semiconductor substrate 10 representing an example of an embodiment of the present invention shown in FIG. 2 is formed of a substrate 12, a buffer layer 14 provided on the substrate 12, a high-resistance layer 15 which is composed of a nitride-based semiconductor (e.g., GaN) provided on the buffer layer 14 and contains a transition metal and a carbon as impurities, and an active layer 22 provided on the high-resistance layer 15.

Here, the substrate 12 is a substrate composed of, e.g., Si or SiC. Further, the buffer layer 14 is a buffer layer constituted of, e.g., a stacked body in which a first layer composed of a nitride-based semiconductor and a second layer composed of a nitride-based semiconductor different from that of the first layer in composition are repeatedly stacked.

The first layer is composed of, e.g., $Al_yGa_{1-y}N$, and the second layer is composed of, e.g., $Al_xGa_{1-x}N$ ($0 \leq x < y \leq 1$).

Specifically, the first layer can be composed of AlN, and the second layer can be composed of GaN.

The active layer 22 has a channel layer 18 composed of a nitride-based semiconductor, and a barrier layer 20 which is provided on the channel layer 18 and composed of a nitride-based semiconductor. The channel layer 18 is composed of, e.g., GaN, and the barrier layer 20 is composed of, e.g., AlGaN.

The high-resistance layer 15 includes a low-carbon layer (a first region) 16 having carbon concentration lower than that of the buffer layer 14 and also having constant concentration of a transition metal, and a high-carbon layer (a second region) 17 which is provided between the low-carbon layer 16 and the channel layer 18, has the carbon concentration higher than that of the low-carbon layer 16, and also contains a transition metal whose concentration is reduced from the low-carbon layer 16 side toward the channel layer 18 side.

It is to be noted that FIG. 1 shows a case where the high-resistance layer 15 contains the transition metal, but the high-transition metal 15 does not have to contain the transition metal.

When the high-resistance layer 15 has the low-carbon layer 16 having the carbon concentration lower than that of the buffer layer 14 and the high-carbon layer 17 which is provided between the low-carbon layer 16 and the channel layer 18 and has the carbon concentration higher than that of the low-carbon layer 16, the crystallinity of the high-resistance layer can be enhanced while maintaining the high resistance of the high-resistance layer 15, a leak current can be thereby reduced, and the crystallinity of the channel layer 18 formed on the high-resistance layer 15 can be also enhanced, thus suppressing occurrence of a decrease in electron mobility or current collapse in the channel layer.

In the semiconductor substrate 10, the transition metal can be Fe.

As described above, Fe can be preferably used as the transition metal. It is to be noted that, as the transition metal, Sc, Ti, V, Cr, Mn, Co, Ni, Cu, Zn, or the like can be likewise used.

Carbon is added when the carbon contained in a source gas (TMG (trimethylgallium) or the like) is taken into a film at the time of growing the nitride-based semiconductor layer based on an MOVPE (metal organic vapor phase epitaxy) method, but it can be added by a doping gas such as propane.

In the semiconductor substrate 10, when the low-carbon layer 16 contains the transition metal, it is preferable that transition metal concentration in the low-carbon layer 16 is higher than transition metal concentration in the high-carbon layer 17.

When the low-carbon layer 16 contains the transition metal at the higher concentration than that of the high-carbon layer 17, an increase in longitudinal direction leak current can be suppressed in the low-carbon layer 16 having the low-carbon layer 16, the crystallinity of the low-carbon layer 16 can be increased, and the crystallinity of the nitride-based semiconductor formed above the first region can be thereby further improved.

It is preferable that the transition metal concentration in the low-carbon layer 16 is $1 \times 10^{17}$ atoms/cm$^3$ or more and $1 \times 10^{20}$ atoms/cm$^3$ or less, particularly $1 \times 10^{18}$ atoms/cm$^3$ or more and $1 \times 10^{19}$ atoms/cm$^3$ or less.

If the transition metal concentration of the low-carbon layer 16 falls within such a concentration range, an increase in longitudinal direction leak current in the low-carbon layer 16 can be surely suppressed, and the crystallinity of the nitride-based semiconductor formed above the low-carbon layer 16 can be surely improved.

In the semiconductor substrate 10, if the low-carbon layer 16 contains the transition metal, it is preferable that the low-carbon layer 16 has a thickness of 3 nm or more and 3000 nm or less, particularly 5 nm or more and 2000 nm or less.

In a case where the low-carbon layer 16 contains the transition metal, when the thickness of the low-carbon layer 16 falls into such a range, the crystallinity of the nitride-based semiconductor formed above the low-carbon layer 16 can be improved while maintaining the high resistance of the low-carbon layer 16.

In the semiconductor substrate 10, when the low-carbon layer 16 does not contain the transition metal, it is preferable that the low-carbon layer 16 has the thickness of 3 nm or more and 500 nm or less, particularly 5 nm or more and 200 nm or less.

In a case where the low-carbon layer 16 does not contain the transition metal, when the thickness of the low-carbon layer 16 falls within such a thin range, the crystallinity of the nitride-based semiconductor formed above the low-carbon layer 16 can be improved while maintaining suppression of the longitudinal direction leak current.

In the semiconductor substrate 10, it is preferable that the low-carbon layer 16 is in contact with the buffer layer 14.

When the low-carbon layer 16 having the high crystallinity is provided to be closer to the buffer layer 14 side (i.e., closer to the substrate 12 side) in this manner, the crystallinity of the nitride-based semiconductor formed above the low-carbon layer 16 can be further effectively improved.

Here, it is preferable that the low-carbon layer 16 has the carbon concentration less than $1 \times 10^{18}$ atoms/cm$^3$, and the second region has the carbon concentration of $1 \times 10^{18}$ atoms/cm$^3$ or more and $1 \times 10^{19}$ atoms/cm$^3$ or less.

As the carbon concentrations of the first region and the second region, such concentration ranges can be preferably used.

A semiconductor device representing an example of an embodiment of the present invention will now be explained with reference to FIG. 3.

Figure 3:
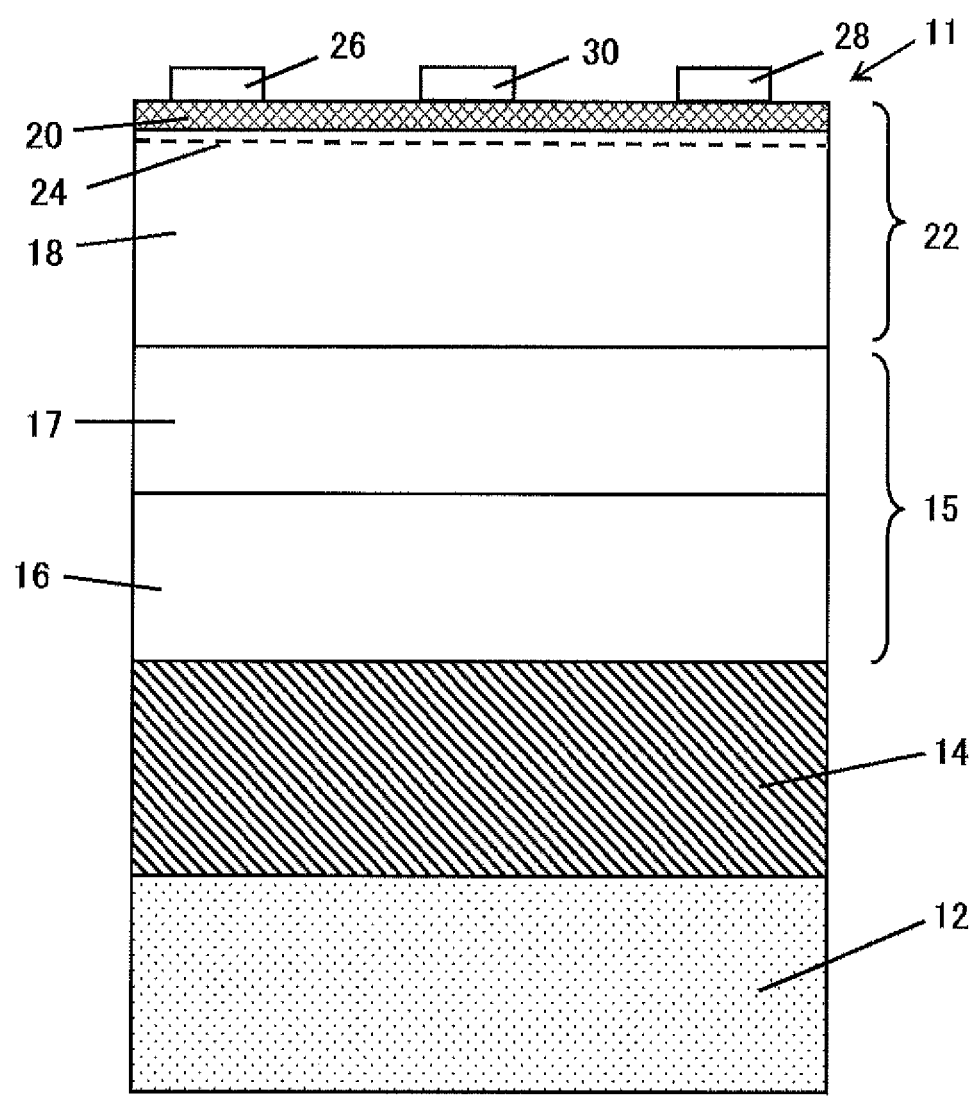
FIG. 3 is a cross-sectional view of a semiconductor device showing an example of an embodiment of the present invention.

FIG. 3 is a cross-sectional view of the semiconductor device showing an example of an embodiment of the present invention.

The semiconductor device 11 is fabricated by using the semiconductor substrate 10 according to the present invention, and has a first electrode 26, a second electrode 28, and a control electrode 30 provided on an active layer 22.

In the semiconductor device 11, the first electrode 26 and the second electrode 28 are arranged such that an electric current flows from the first electrode 26 to the second electrode 28 through a two-dimensional electron gas layer 24 formed in the channel layer 18.

The electric current flowing between the first electrode 26 and the second electrode 28 can be controlled by an electric potential applied to the control electrode 30.

The semiconductor device 11 is fabricated by using the semiconductor substrate 10 representing an example of an embodiment of the present invention, and the semiconductor device 11 can enhance the crystallinity of the high-resistance layer while maintaining the high resistance of the high-resistance layer, thereby reduce the leak current, and also enhance the crystallinity of the channel layer formed on the high-resistance layer, thus suppressing occurrence of a decrease in electron mobility or current collapse in the channel layer.

EXAMPLES

The present invention will now be more specifically explained hereinafter based on Examples and a Comparative Example, but the present invention is not restricted thereto.

Example 1

Such a semiconductor substrate as shown in FIG. 2 having a concentration distribution in a depth direction shown in FIG. 1 was fabricated. However, Fe was used as the transition metal, the carbon concentration in the low-carbon layer 16 was set to $5 \times 10^{17}$ atoms/cm$^3$, the carbon concentration in the high-carbon layer 17 was set to $2 \times 10^{18}$ atoms/cm$^3$, and the concentration of Fe in the low-carbon layer 16 was set to $3 \times 10^{18}$ atoms/cm$^3$. Furthermore, the thickness of the low-carbon layer 16 was set to 500 nm, and the thickness of the high-carbon layer 17 was set to 1600 nm.

Such a semiconductor device as shown in FIG. 3 was fabricated by using the fabricated semiconductor substrate.

Example 2

Figure 4:
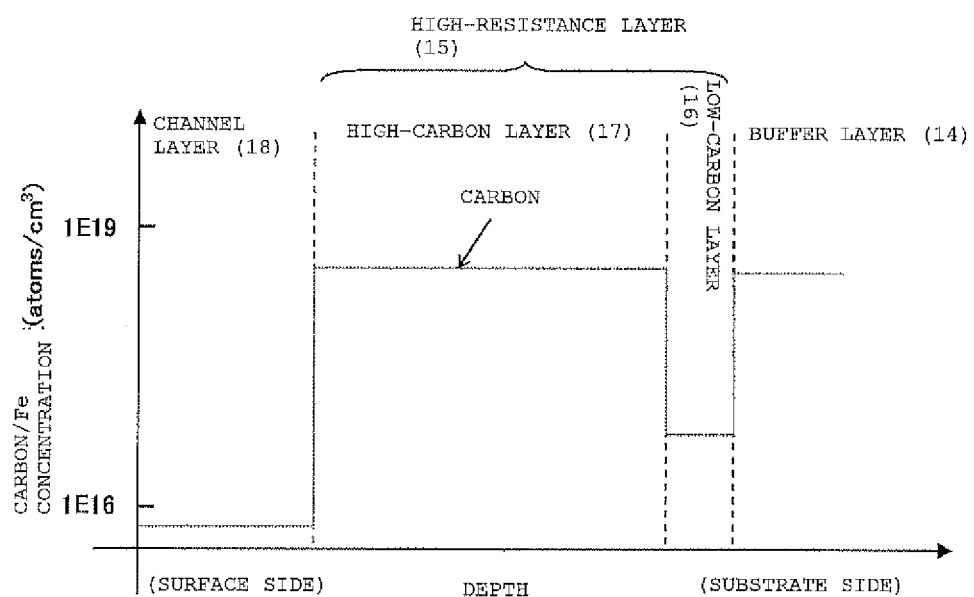
FIG. 4 is a view showing an impurity concentration distribution in a depth direction of a semiconductor substrate according to Example 2.

Such a semiconductor substrate as shown in FIG. 2 having a concentration distribution in a depth direction shown in FIG. 4 was fabricated. However, no transition metal was added to the high-resistance layer 15, the carbon concentration in the low-carbon layer 16 was set to $3 \times 10^{17}$ atoms/cm$^3$, and the carbon concentration in the high-carbon layer 17 was set to $2 \times 10^{18}$ atoms/cm$^3$. Furthermore, the thickness of the low-carbon layer 16 was set to 100 nm, and the thickness of the high-carbon layer 17 was set to 1600 nm.

Such a semiconductor device as shown in FIG. 3 was fabricated by using the fabricated semiconductor substrate.

Example 3

A semiconductor substrate was fabricated in the same manner as Example 2. However, the thickness of the low-carbon layer 16 was set to 200 nm, and the thickness of the high-carbon layer 17 was set to 1500 nm.

Figure 8:
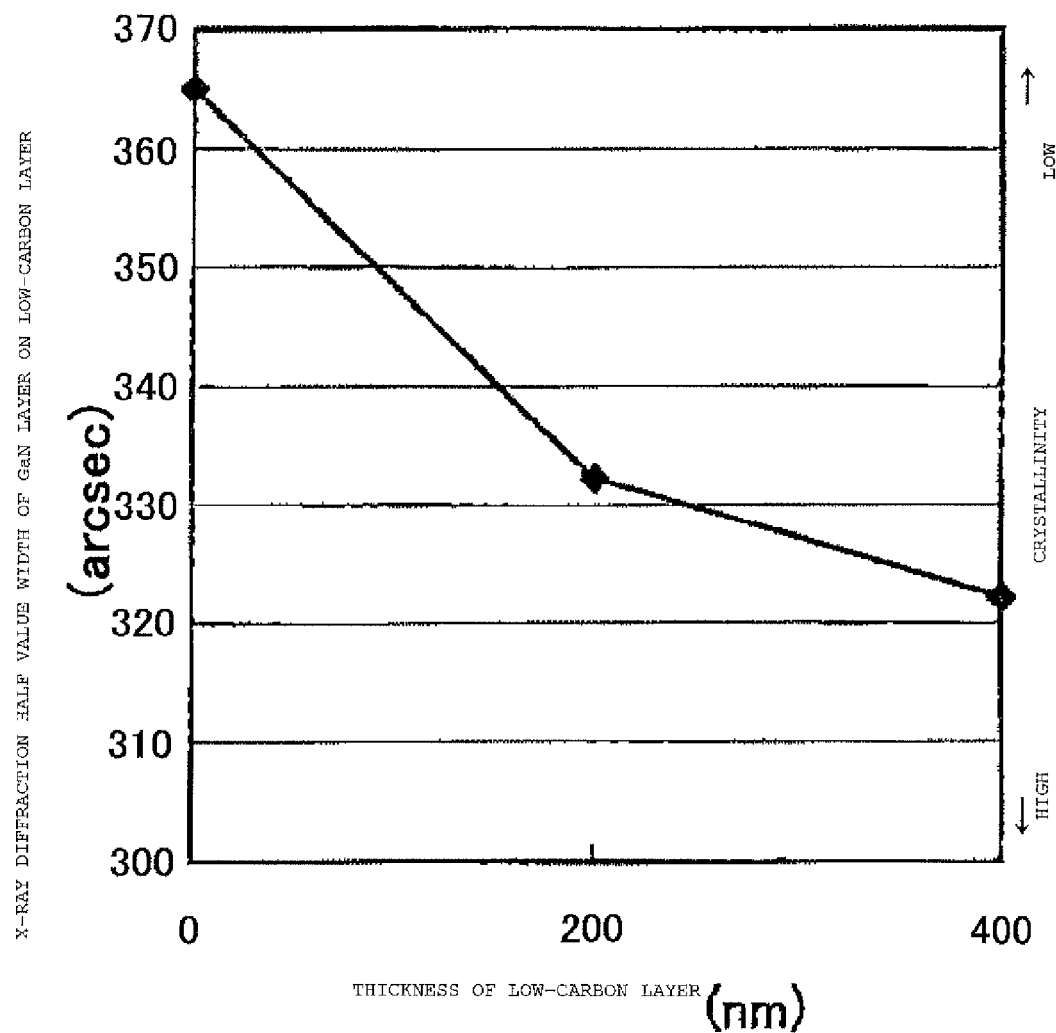
FIG. 8 is a view showing low-carbon layer film thickness dependence of crystallinity of a GaN layer on the low-carbon layer.
Figure 9:
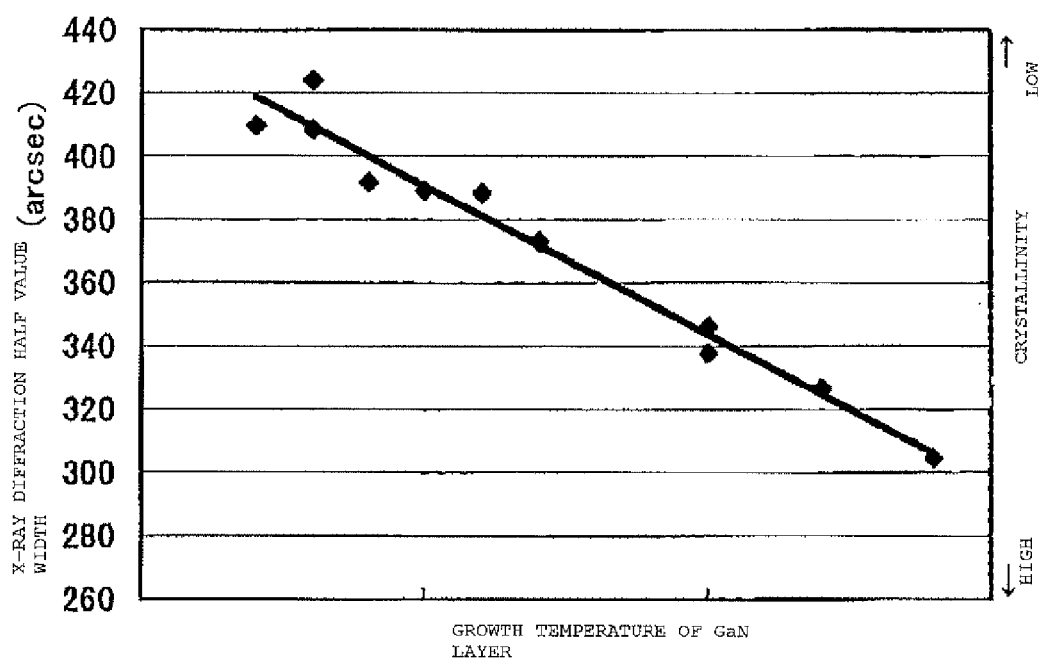
FIG. 9 is a view showing growth temperature dependence of crystallinity of a high-resistance layer.
Figure 10:
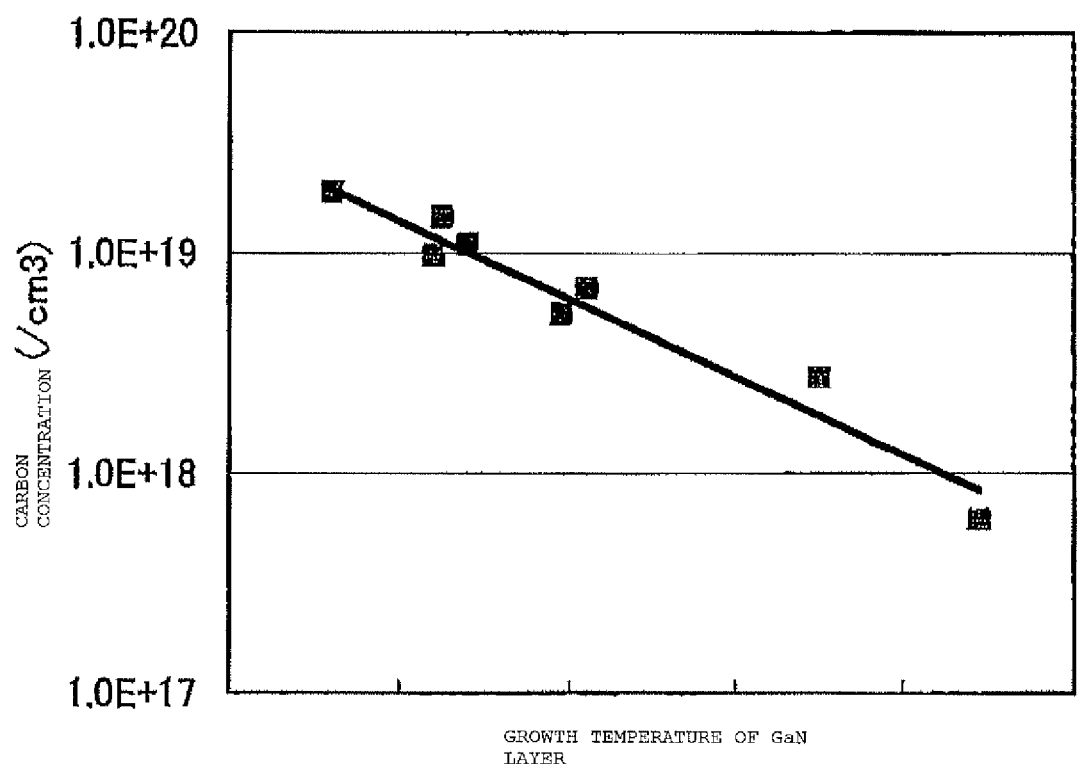
FIG. 10 is a view showing growth temperature dependence of carbon concentration of the high-resistance layer.

In the fabricated semiconductor substrate, the crystallinity of a GaN layer (including the high-carbon layer 17) in a 0002 direction above the low-carbon layer 16 was measured by using X-ray diffraction. FIG. 8 shows its result.

Such a semiconductor device as shown in FIG. 3 was fabricated by using the fabricated semiconductor substrate.

Example 4

A semiconductor substrate was fabricated in the same manner as Example 2. However, the thickness of the low-carbon layer 16 was set to 400 nm, and the thickness of the high-carbon layer 17 was set to 1300 nm.

In the fabricated semiconductor substrate, the crystallinity of a GaN layer (including the high-carbon layer 17) in the 0002 direction above the low-carbon layer 16 was measured by using the X-ray diffraction. FIG. 8 shows its result.

Such a semiconductor device as shown in FIG. 3 was fabricated by using the fabricated semiconductor substrate.

Comparative Example

A semiconductor substrate was fabricated in the same manner as Example 2. However, the low-carbon layer 16 was not formed, and the thickness of the high-carbon layer 17 was set to 1700 nm.

In the fabricated semiconductor substrate, the crystallinity of a GaN layer including the high-carbon layer 17 in the 0002 direction was measured by using the X-ray diffraction. FIG. 8 shows its result.

Such a semiconductor device as shown in FIG. 3 (however, the low-carbon layer 16 is not formed) was fabricated by using the fabricated semiconductor substrate.

Example 5

Figure 5:
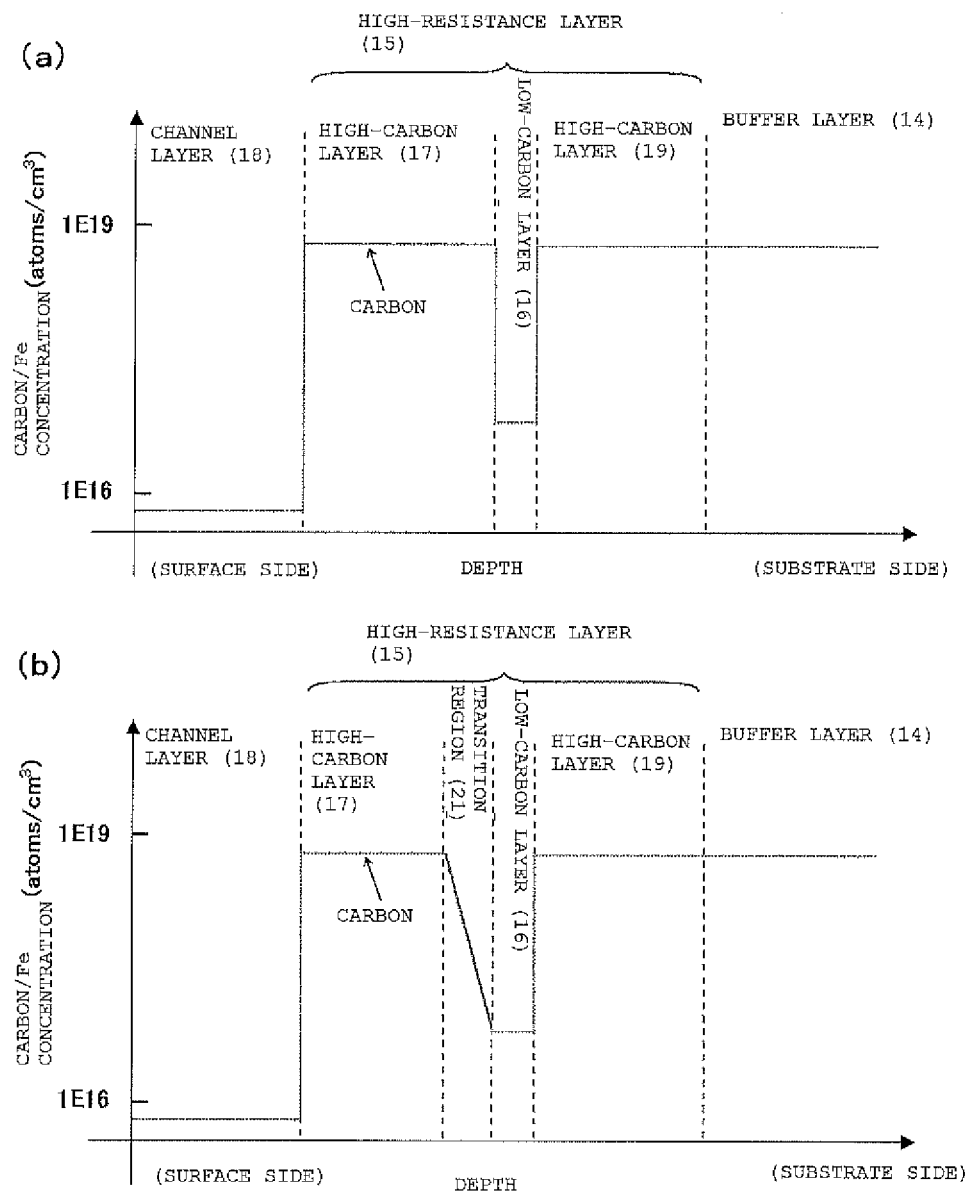
FIG. 5 is a view showing an impurity concentration distribution in a depth direction of a semiconductor substrate according to Example 5.
Figure 6:
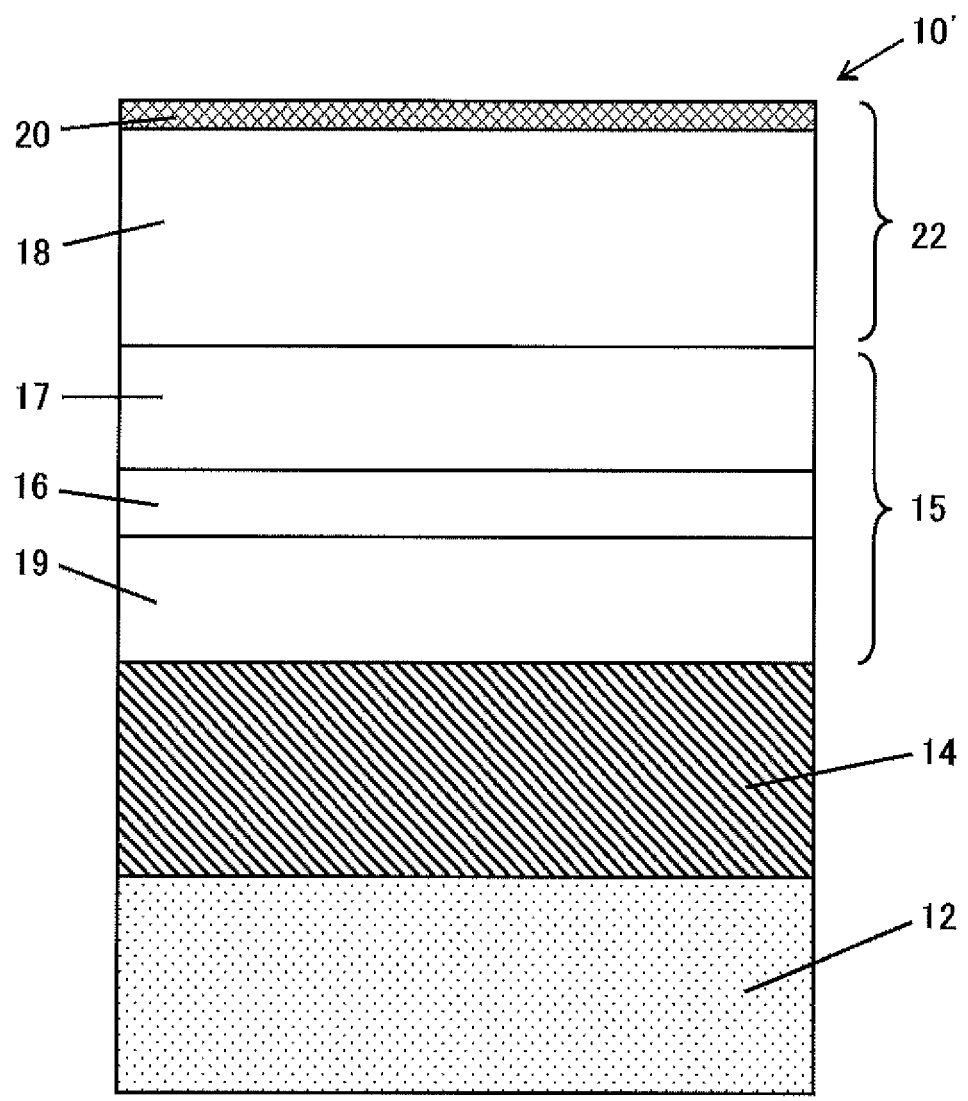
FIG. 6 is a cross-sectional view of the semiconductor substrate according to Example 5.

Such a semiconductor substrate as shown in FIG. 6 having a concentration distribution in a depth direction shown in FIG. 5($a$) was fabricated.

A semiconductor substrate 10' shown in FIGS. 5 and 6 has the same configuration as the semiconductor substrate 10 shown in FIG. 4 and FIG. 2 except that a high-carbon layer (a third region) 19 having carbon concentration higher than that of the low-carbon layer 16 is interposed between the buffer layer 14 and the low-carbon layer 16 in the high-resistance layer 15. However, no transition metal was added to the high-resistance layer 15, the carbon concentration in the low-carbon layer 16 was set to $3 \times 10^{17}$ atoms/cm$^3$, the carbon concentration in the high-carbon layer 17 was set to $2 \times 10^{18}$ atoms/cm$^3$, and the carbon concentration in the high-carbon layer 19 was set to $2 \times 10^{18}$ atoms/cm$^3$. Moreover, a thickness of the low-carbon layer 16 was set to 100 nm, a thickness of the high-carbon layer 17 was set to 800 nm, and a thickness of the high-carbon layer 19 was set to 800 nm.

It is to be noted that, as shown in FIG. 5($b$), a transition region 21 where the carbon concentration gradually increases may be provided between the low-carbon layer 16 and the high-carbon layer 17.

Figure 7:
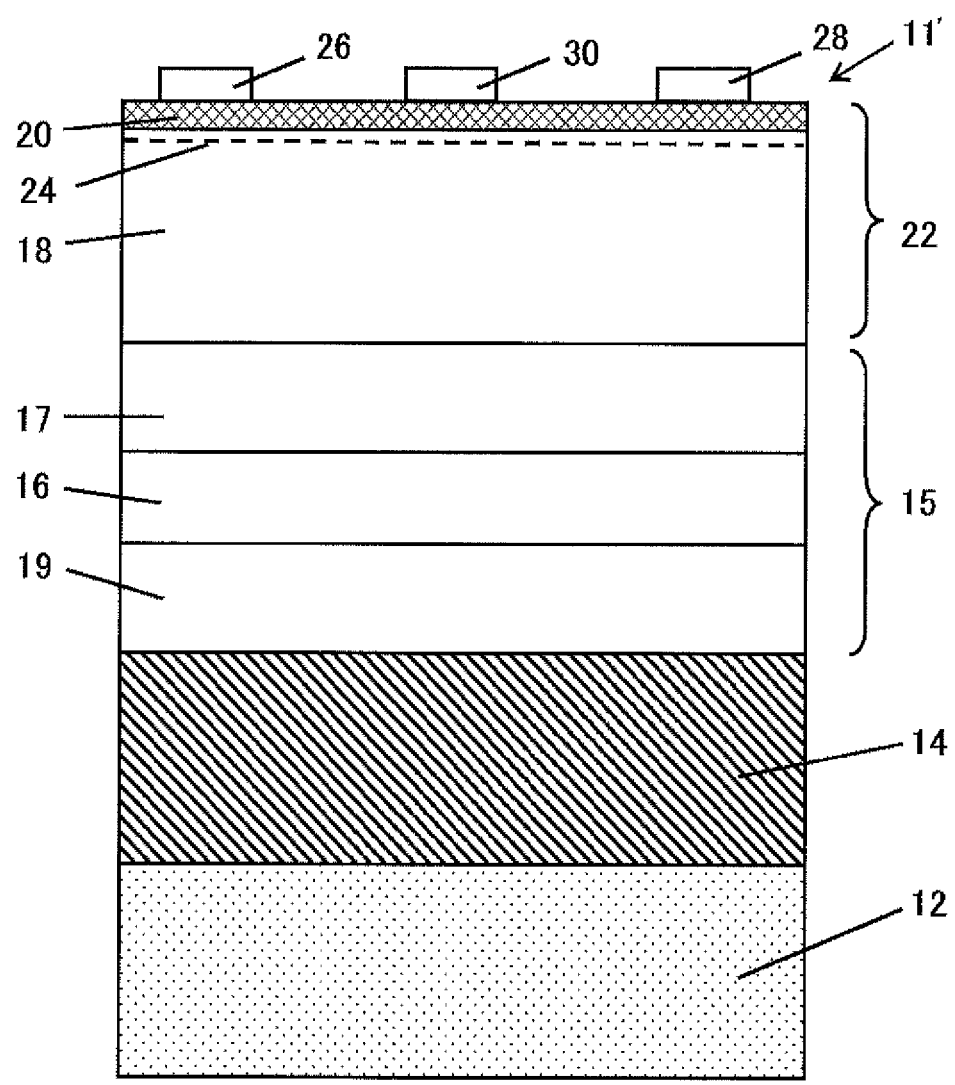
FIG. 7 is a cross-sectional view of a semiconductor device according to Example 5.

Such a semiconductor device as shown in FIG. 7 was fabricated by using the fabricated substrate.

A semiconductor device 11' shown in FIG. 7 has the same configuration as that of the semiconductor device 11 shown in FIG. 3 except that the high-carbon layer (the third region) 19 having the carbon concentration higher than the low-carbon layer 16 is interposed between the buffer layer 14 and the low-carbon layer 16 in the high-resistance layer 15.

As can be understood from FIG. 8, a film thickness of the low-carbon layer 16 increases, and the crystallinity of the GaN layer above the low-carbon 16 is enhanced. That is, as compared with Comparative Example where the low-carbon layer 16 is not formed, the crystallinity of the GaN layer (including the high-carbon layer 17) above the low-carbon layer 16 of the semiconductor substrate according to each of Examples 3 and 4 where the low-carbon layer 16 is formed is high, and Example 4 where the low-carbon layer 16 has the large film thickness has the crystallinity much higher than that in Example 3 where the low-carbon layer 16 has the small film thickness.

Additionally, in the semiconductor device according to each of Examples 1 to 5, it was confirmed that, as compared with the semiconductor device according to Comparative Example, a longitudinal direction leak current is reduced, and occurrence of a decrease in electron mobility or current collapse is suppressed in the channel layer.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

For example, in each embodiment, any one of the low-carbon layer 16 and the high-carbon layers 17 and 19 may have the carbon concentration which gradually increases from the substrate 12 side toward the channel 18 side.

The invention claimed is:

1. A semiconductor substrate comprising:
a substrate;
a buffer layer, which is composed of a nitride-based semiconductor containing carbon, provided on the substrate;
a high-resistance layer, which is composed of a nitride-based semiconductor containing carbon, provided on the buffer layer; and
a channel layer, which is composed of a nitride-based semiconductor, provided on the high-resistance layer,
wherein the high-resistance layer comprises:
a first region having carbon concentration lower than that of the buffer layer; and
a second region which is provided between the first region and the channel layer, and has the carbon concentration higher than the first region, and
wherein the first region contains a transition metal, and transition metal concentration in the first region is higher than transition metal concentration in the second region.

2. The semiconductor substrate according to claim 1, wherein the transition metal concentration in the first region is $1\times10^{17}$ atoms/cm$^3$ or more and $1\times10^{20}$ atoms/cm$^3$ or less.

3. The semiconductor substrate according to claim 2, wherein the transition metal concentration in the first region is $1\times10^{18}$ atoms/cm$^3$ or more and $1\times10^{19}$ atoms/cm$^3$ or less.

4. The semiconductor substrate according to claim 1, wherein a thickness of the first region is 3 nm or more and 3000 nm or less.

5. The semiconductor substrate according to claim 2, wherein a thickness of the first region is 3 nm or more and 3000 nm or less.

6. The semiconductor substrate according to claim 1, wherein the first region is in contact with the buffer layer.

7. The semiconductor substrate according to claim 2, wherein the first region is in contact with the buffer layer.

8. The semiconductor substrate according to claim 1, wherein the carbon concentration in the first region is less than $1\times10^{18}$ atoms/cm$^3$, and the carbon concentration in the second region is $1\times10^{18}$ atoms/cm$^3$ or more and $1\times10^{19}$ atoms/cm$^3$ or less.

9. The semiconductor substrate according to claim 2, wherein the carbon concentration in the first region is less than $1\times10^{18}$ atoms/cm$^3$, and the carbon concentration in the second region is $1\times10^{18}$ atoms/cm$^3$ or more and $1\times10^{19}$ atoms/cm$^3$ or less.

10. A semiconductor device fabricated by using the semiconductor substrate according to claim 1, wherein electrodes are provided on the channel layer.

11. A semiconductor device fabricated by using the semiconductor substrate according to claim 2, wherein electrodes are provided on the channel layer.

* * * * *